(12) United States Patent
Shioda et al.

(10) Patent No.: US 7,844,143 B2
(45) Date of Patent: Nov. 30, 2010

(54) ELECTRICAL AND OPTICAL HYBRID FILM, AND ELECTRONIC APPARATUS RECEIVING THE SAME

(75) Inventors: Tsuyoshi Shioda, Chiba (JP); Kazuhiro Yamada, Ichihara (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 108 days.

(21) Appl. No.: 12/300,368

(22) PCT Filed: May 11, 2007

(86) PCT No.: PCT/JP2007/059710
§ 371 (c)(1),
(2), (4) Date: Nov. 11, 2008

(87) PCT Pub. No.: WO2007/132751
PCT Pub. Date: Nov. 22, 2007

(65) Prior Publication Data
US 2009/0317048 A1    Dec. 24, 2009

(30) Foreign Application Priority Data
May 12, 2006    (JP)    ............................ 2006-134495

(51) Int. Cl.
*G02B 6/10*    (2006.01)
*G02B 6/12*    (2006.01)
(52) U.S. Cl. ........................................ 385/14; 385/129
(58) Field of Classification Search ............... 385/14, 385/129–132; 257/666, 668, 669
See application file for complete search history.

(56) References Cited

U.S. PATENT DOCUMENTS

| | | | | |
|---|---|---|---|---|
| 6,829,398 | B2* | 12/2004 | Ouchi | ......................... 385/14 |
| 7,184,617 | B2* | 2/2007 | Korenaga et al. | ............. 385/14 |
| 7,589,282 | B2* | 9/2009 | Yamada et al. | .............. 174/255 |

FOREIGN PATENT DOCUMENTS

| | | |
|---|---|---|
| JP | 2813713 B2 | 10/1998 |
| JP | 2001-201670 A | 7/2001 |
| JP | 2004-022666 A | 1/2004 |

(Continued)

OTHER PUBLICATIONS

Takeshi Shioda et al. "Kokukkyoku Polyimide Kodo Haro Film" ("Bending Stable Polyimide Waveguide Film"), The Institute of Electronics, Information and Communication Engineers Electronics Society Taikai Koen Ronbunshu 1, Sep. 7, 2005, p. 198 with English Translation.

(Continued)

*Primary Examiner*—Frank G Font
(74) *Attorney, Agent, or Firm*—Buchanan Ingersoll & Rooney PC

(57) ABSTRACT

An electrical and optical hybrid film having high resistance to bending. The electrical and optical hybrid film has an optical waveguide film and an electrical wiring film on the optical waveguide film. The electrical and optical hybrid film has, between its opposite ends, a separated section where the electrical wiring film and the optical waveguide film are not secured to each other. The optical waveguide film has, at the separated section, a slit extending in the longitudinal direction, and the slit penetrates the optical waveguide film.

5 Claims, 4 Drawing Sheets

FOREIGN PATENT DOCUMENTS

| | | |
|---|---|---|
| JP | 2004-118117 A | 4/2004 |
| JP | 2005-057259 A | 3/2005 |
| JP | 2006-084488 A | 3/2006 |
| JP | 2006-091706 A | 4/2006 |
| JP | 2006171625 A * | 6/2006 |

OTHER PUBLICATIONS

Takeshi Shioda, "Hikari Denki Konsal Kiban no Kaihatsu Doko", The Journal of the Institute of Electronics, Information and Communication Engineers, Jun. 1, 2005, pp. 435-439, vol. 88, No. 6 with English Translation.

* cited by examiner

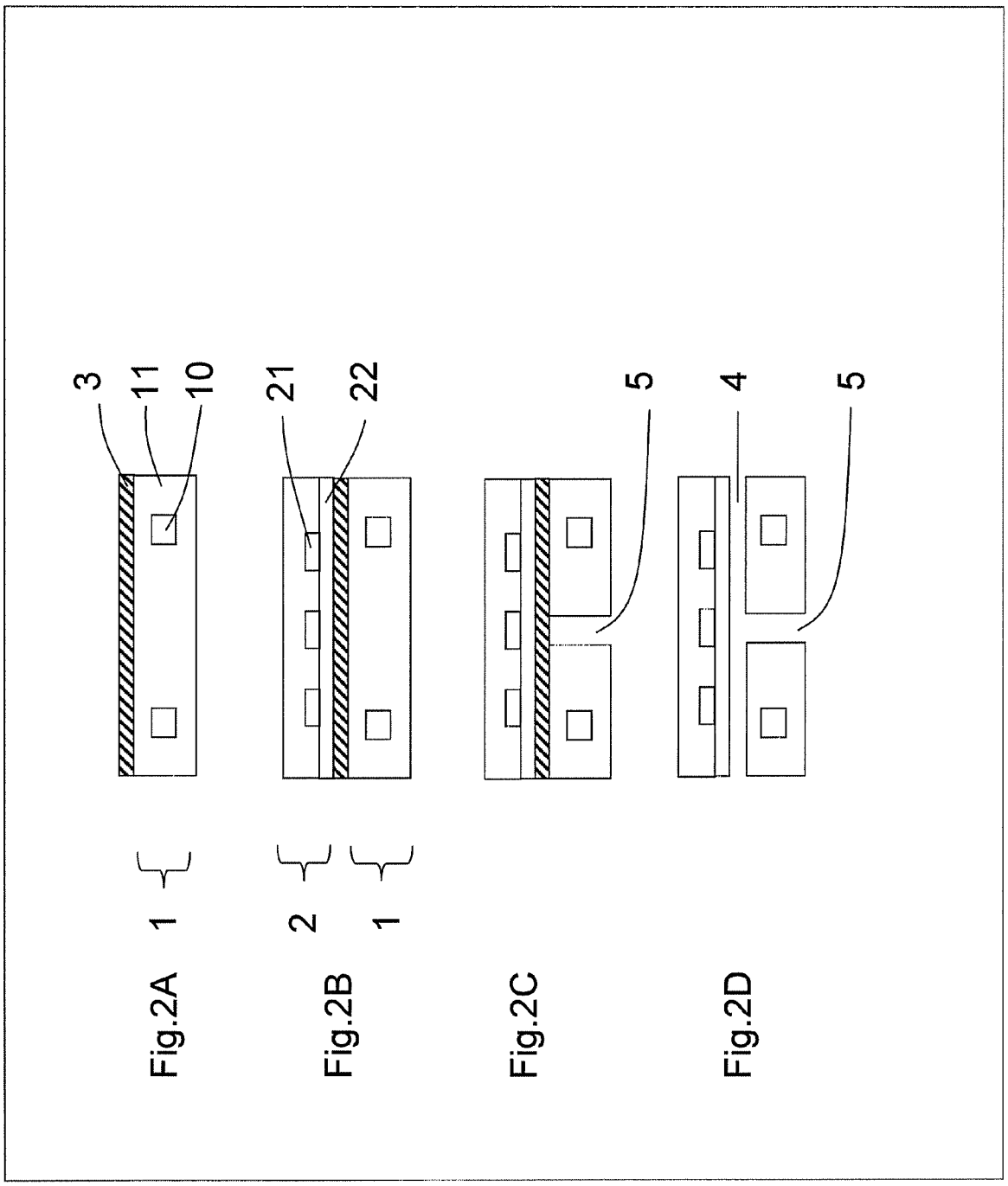

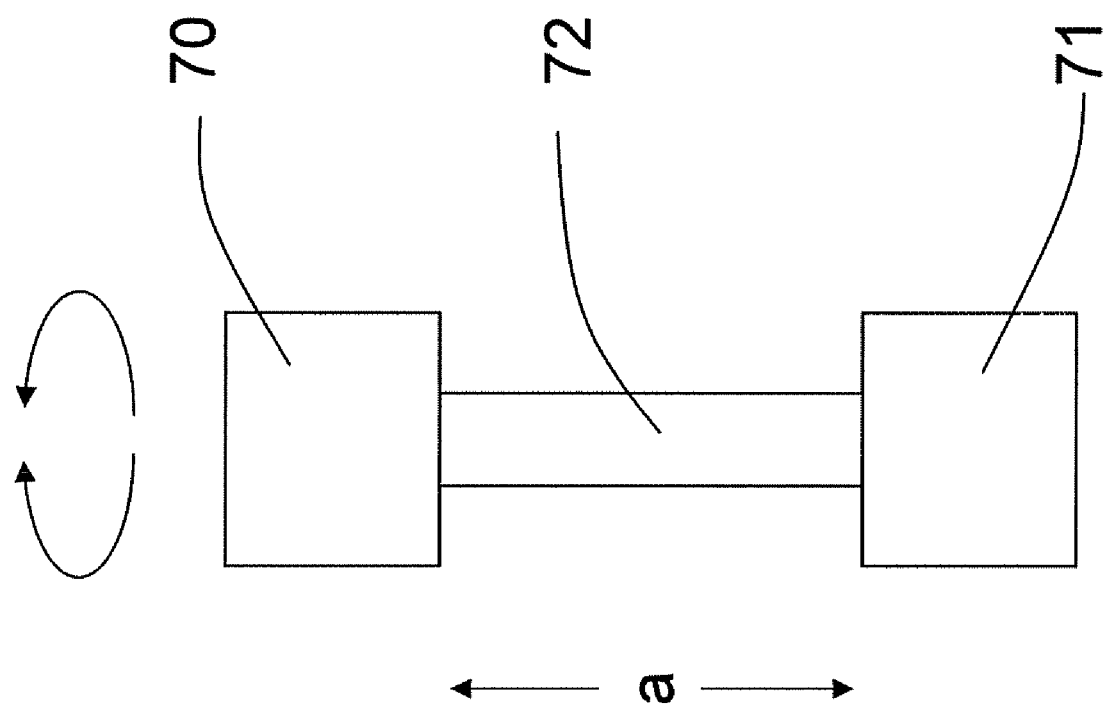

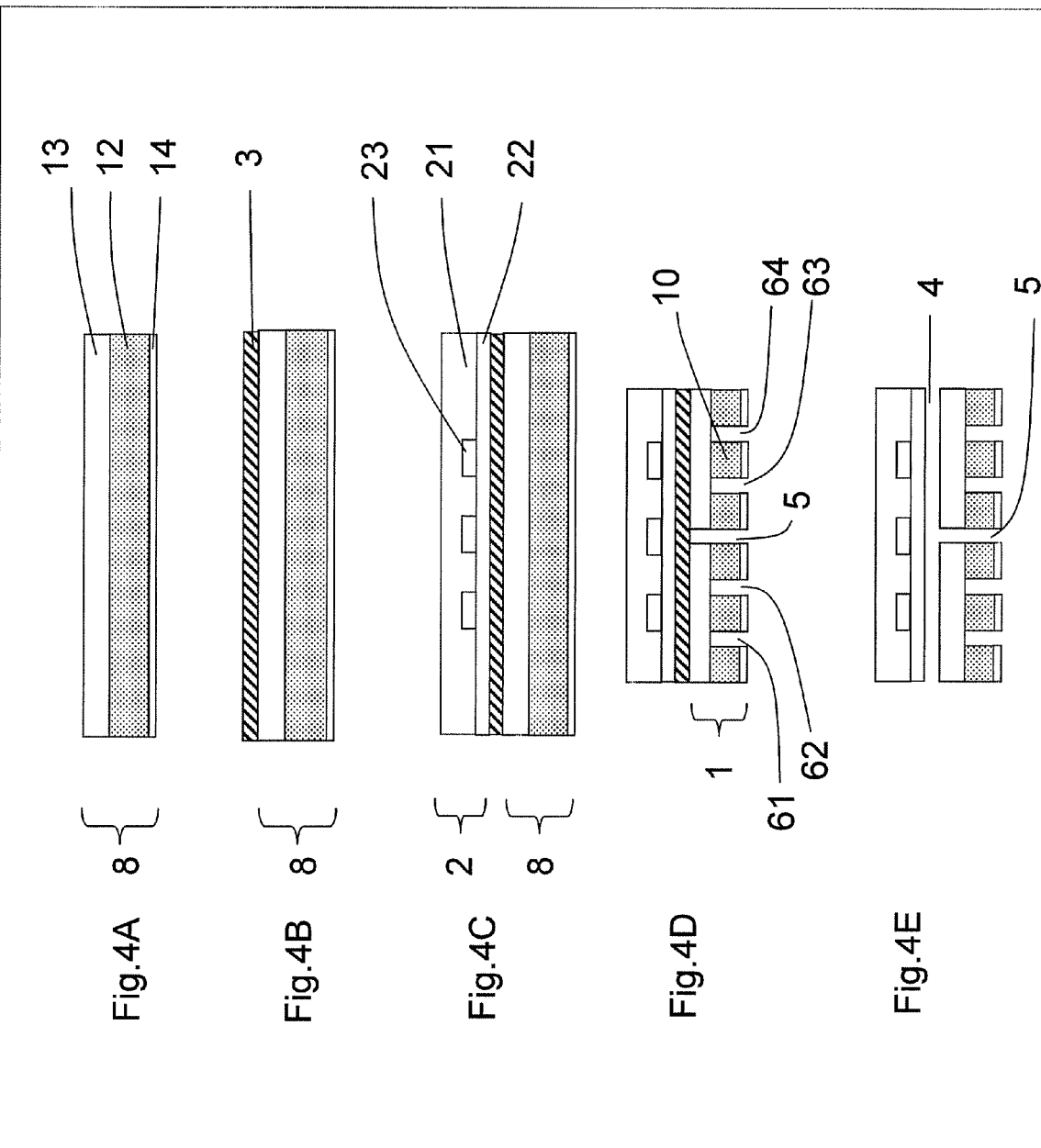

ELECTRICAL AND OPTICAL HYBRID FILM, AND ELECTRONIC APPARATUS RECEIVING THE SAME

TECHNICAL FIELD

The present invention relates to an electrical and optical hybrid film composed of an optical waveguide film and an electrical wiring film.

BACKGROUND ART

A flexible electrical wiring board (which also refers to an electrical wiring film) link between two sections connected by a hinge in a cell phone and the like. In the hinge portion, the electrical wiring film is disposed so as to wound a hinge axis and the like with a curvature radius according to the size of the hinge.

However, the electrical wiring film has been recently complicated because torsional rotation and the like are adopted in the rotation mechanism of the hinge. That is, since the electrical wiring film is bent under more severe conditions, there has been a problem that the conventional electrical wiring is damaged because the conventional electrical wiring can not endure the stress generated at the time of bending.

To cope with this problem, a method of providing a slit penetrating a film at a stress concentrated part of an electrical wiring film has been disclosed in Patent Document 1. However, through the method, the slit is required to be provided in an extremely narrow space (for example, 0.1 mm or less) between the electrical wirings, therefore the slit is difficult to process.

In addition to this, a method of forming an electrical wiring film in a complicated shape is also proposed. However, through this method the area of the film becomes lager so that the cost increases and accommodating the film in an electronic apparatus and the like is difficult.

By the way, if electric transmission is replaced by optical transmission, the transmission rate per one channel may be increased, thus the number of transmission channels can be reduced. As a result, the width of the wiring film may be dramatically reduced so as to reduce of the stress generated on the film even if film is bent under severe conditions.

An optical waveguide is known as a member that performs optical transmission. In the optical waveguide, an inorganic material such as quartz glass, multicomponent glass or the like is used, which has characteristics of having a low optical propagation loss and a wide transmission band. Recently, optical waveguide made of a polymer material having excellent processability and cost performance attracts attention. As the polymer optical waveguide film, there has been proposed a flat optical waveguide composed of a core-clad structure in which a core is made of a polymer material excellent in transparency such as polymethylmethacrylate (PMMA) or polystyrene and a clad is made of a polymer material which has a lower refractive index than the core material. In addition, there has been proposed a flat optical waveguide with a low optical propagation loss using a polyimide which is a polymer material excellent in heat resistance and transparency (Patent Document 2). Since these optical waveguide films have flexibility, they are expected as a material in place of an electrical wiring film.

In the case where an optical waveguide is used for an electronic apparatus, an electrical wiring is also required for supplying electric power and the like in many cases, thus both of an optical wiring and an electrical wiring are required. In this case, it is preferable to use a flexible electrical and optical hybrid substrate (which also refers to an electrical and optical hybrid film) in which an optical waveguide and an electrical wiring board are integrally formed, which result in saving space, reduction of thickness and size, and improvement of the embedding workability.

However, even when an electrical and optical hybrid film is used, the number of the electrical wiring is increased in proportion to the sophistication of an electronic apparatus. When the number of the electrical wiring is increased, width of the film is also increased, which results in that the film becomes unable to endure severe bending. To solve this problem, a slit on an electrical wiring film may be provided or the shape of the film may be made complicated. However these methods can not solve the problem as described above.

That is, an electrical and optical hybrid film having a high bending resistance has been desired, which is not damaged even if it is bent under severe conditions, despite a simple shape such as a linear shape and the like.

Patent Document 1: Japanese Patent Application Laid-Open No. 2005-57259

Patent Document 2: Japanese Patent No. 2813713

DISCLOSURE OF INVENTION

Problems to be Solved by the Invention

As described above, an object of the present invention is to provide an electrical and optical hybrid film having a high bending resistance.

Means for Solving the Problems

As a result of keen examination, the present inventors have found that, the bending resistance of a film is increased by providing a slit in an optical waveguide film of an electrical and optical hybrid film in which the electrical wiring film and optical waveguide film are separated in the portion where the film is bent or twisted, and have completed the present invention.

That is, the above problem may be solved by an electrical and optical hybrid film of the present invention described below and an electronic apparatus accommodating the electrical and optical hybrid film.

[1] An electrical and optical hybrid film having an optical waveguide film and an electrical wiring film on the optical waveguide film, wherein the electrical and optical hybrid film has, between the both ends in the longitudinal direction, a spaced portion in which the electrical wiring film and the optical waveguide film are not bonded to each other, the optical waveguide film has a slit extending in the longitudinal direction in the spaced portion, and the slit penetrates the optical waveguide film.

[2] The electrical and optical hybrid film described in [1], wherein the length of an electrical wiring film in the longitudinal direction in the spaced portion is longer than the length of an optical waveguide film in the longitudinal direction in the spaced portion.

[3] The electrical and optical hybrid film described in [1] or [2], wherein the slit is provided through between the both ends of the optical waveguide film in the longitudinal direction.

[4] An electronic apparatus accommodating the electrical and optical hybrid film described in any of [1] to [3], wherein the electrical and optical hybrid film may be bent or twisted in the spaced portion.

EFFECT OF THE INVENTION

The present invention may provide an electrical and optical hybrid film having a high bending resistance.

BRIEF DESCRIPTION OF THE DRAWINGS

FIG. 2 is a view illustrating an example of a method for producing an electrical and optical hybrid film of the present invention;

FIG. 3 is a view illustrating a torsion test; and

FIG. 4 is a view illustrating an example of a method for producing an electrical and optical hybrid film of the present invention.

BEST MODE FOR CARRYING OUT THE INVENTION

1. Electrical and Optical Hybrid Film

An electrical and optical hybrid film of the present invention composed of an optical waveguide film and an electrical wiring film on the optical waveguide film, wherein the electrical and optical hybrid film has a spaced portion between the both ends in the longitudinal direction, the optical waveguide film has a slit in the spaced portion, and the slit penetrates the optical waveguide film.

The optical waveguide film refers to a film-shaped device which has a core and a clad and propagates light through the core. The core refers to a portion that has a high refractive index and mainly propagates light in the optical waveguide, and the clad refers to a portion having a low refractive index compared to that of the core. Since the optical waveguide film has flexibility, it is preferably formed with a polymer material. The polymer material forming the optical waveguide film is not limited, but polyimide is preferable among polymer materials.

The electrical wiring film refers to a member having a conductor layer on an insulator film made of a polymer material. The polymer material forming an insulator film is not particularly limited, but a polyimide is preferable among polymer materials. An electrical wiring pattern is generally formed in a conductor layer of the electrical wiring film, but the electrical wiring film may also include a structure in which a conductor layer is simply provided on the insulator film surface. The electrical wiring pattern refers to an electrical wiring circuit, and the term "patterning" refers to forming a circuit. The conductor layer may be formed with a metal and the like such as copper and the like, and the electrical wiring pattern is formed by etching a metal and the like. In addition, the conductor layer and the electrical wiring pattern may be provided by using an conductive paste and the like in which a conductive material is filled in a resin. The electrical wiring film may have a conductor layer on its one surface or both surfaces. Further, in the case of a multilayer electrical wiring film, a conductor layer can be an interior layer.

Figure 1A:
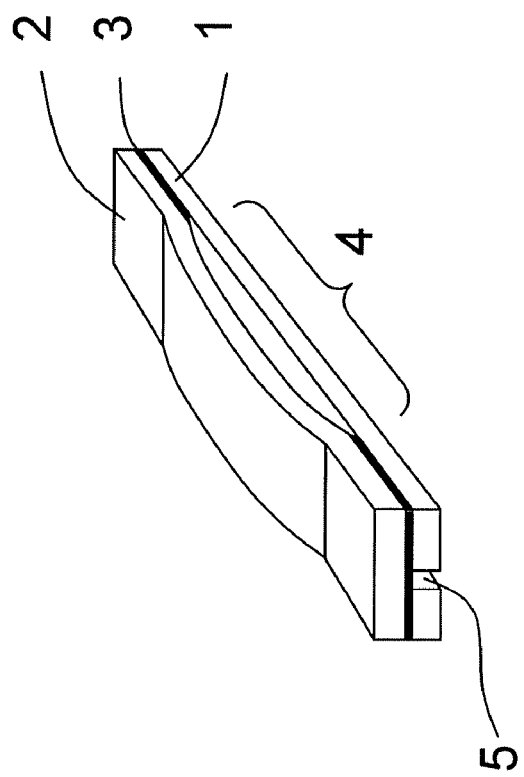
FIG. 1A is a perspective view illustrating an example of an electrical and optical hybrid film of the present invention.

FIG. 1 shows the embodiment 1 of the electrical and optical hybrid film of the present invention. In FIG. 1A, 1 is an optical waveguide film, 2 is an electrical wiring film laminated on the optical waveguide film, and both are bonded with adhesive 3 at the both ends. 4 is a spaced portion in which the both films are not bonded with each other. Optical waveguide film 1 is provided with a core and a clad extending in the longitudinal direction (neither of which is indicated in FIG. 1).

The term "bonded" refers to a state in which an optical waveguide film and an electrical wiring film are firmly pasted and bonded with each other. The bonding method includes a method of fusing both films by applying ultrasonic waves or heat, a method of bonding both films mechanically using a jig such as a clip and the like, a method of bonding both films mechanically by engaging both films, and a method of bonding both films using an adhesive.

Figure 1B:
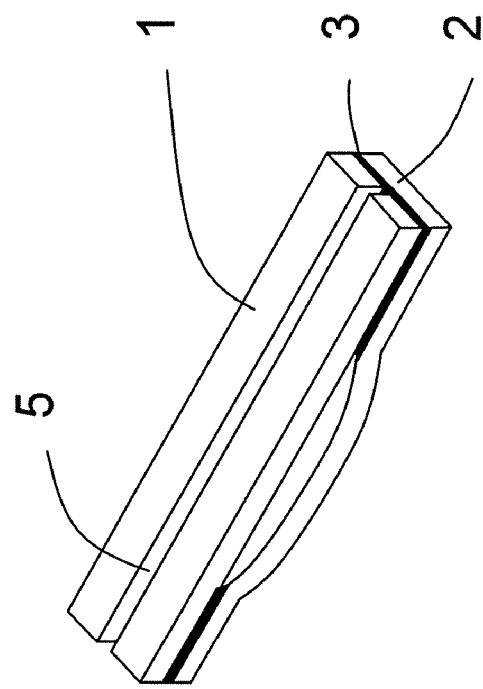
FIG. 1B is a perspective view of the electrical and optical hybrid film of FIG. 1A, which is viewed from the opposite side to that of FIG. 1A.

FIG. 1B is a perspective view of the electrical and optical hybrid film of FIG. 1A, which is viewed from the backside. Optical waveguide film 1 is provided with slit 5 along the longitudinal direction penetrating the optical waveguide film.

The shape of the electrical and optical hybrid film of the present invention is not particularly limited, but the electrical and optical hybrid film preferably has a length of 50 to 200 mm in the longitudinal direction and a width of 1 to 30 mm. The electrical and optical hybrid film especially preferably has a length of 80 to 150 mm in the longitudinal direction and a width of 1.5 to 3 mm or 7 to 15 mm. The optical waveguide film in the spaced portion preferably has a thickness of 10 to 200 µm, and more preferably of 20 to 100 µm. The electrical wiring film in the spaced portion has preferably a thickness of 20 to 80 µm, and more preferably of 20 to 50 µm. The term "to" in the specification expresses the range including the values of the both sides.

The electrical and optical hybrid film of the present invention may reduce the stress generated on the film when the electrical and optical hybrid film is bent or twisted because it has the spaced portion. As a result, the resistance of the electrical and optical hybrid film to bending or torsion is increased.

The spaced portion refers to a section in which the electrical wiring film and the optical waveguide film are not bonded with each other. Although an electrical wiring film and an optical waveguide film are bonded with each other at the both ends of the electrical and optical hybrid film normally, both films may be bonded in a section other than the both ends. Especially both films are preferably bonded at the input and output portion or in the vicinity thereof of the optical waveguide film of the optical waveguide. The reason why that in the vicinity of the input and output portion of the optical waveguide film, an optoelectric conversion element and the like are frequently mounted on the electrical wiring film, and the optical input and output portion and the conversion element are required to be disposed at a high spatial accuracy. The position of the spaced portion is not particularly limited if the spaced portion is disposed between the both ends of the electrical and optical hybrid film. As will be mentioned later, a part of the electrical and optical hybrid film of the present invention may be bent or twisted in a state where it is accommodated in an electronic apparatus. Therefore, a part of the spaced portion of the electrical and optical hybrid film is preferably located in the position where the film may be bent or twisted when the film is accommodated in an electronic apparatus and the like. In other words, in the electrical and optical hybrid film accommodated in an electronic apparatus and the like, an electrical wiring film and an optical waveguide film are preferably separated in the position to be bent or twisted. The length of the spaced portion in the longitudinal direction is preferably 5 to 150 mm depending on the shape of the electrical and optical hybrid film.

In order to bond the electrical wiring film and the optical waveguide film, an adhesive may be used as mentioned above. A known adhesive may be used as the adhesive used in the present invention. The example includes an epoxy-based adhesive.

In the spaced portion of the electrical and optical hybrid film of the present invention, a slit is provided on the electrical and optical hybrid film. Due to the synergistic effect of the slit and the spaced portion, the stress generated on a film may be reduced when the electrical and optical hybrid film is bent or twisted. That is, the electrical and optical hybrid film has excellent bending resistance.

The slit refers to a cut and is provided so as to penetrate the optical waveguide film. The slit preferably has a width of 10 to 100 μm. One or more slits may be provided, but plural slits are preferably provided when the width of the electrical and optical hybrid film is large.

The slit may be provided only in the spaced portion or may be provided through between the both ends of the electrical and optical hybrid film (on the whole along the longitudinal direction). When two or more cores are formed on the optical waveguide film, the slit is preferably provided between two cores adjacent to each other and through between the both ends of the electrical and optical hybrid film. The reason why that a phenomenon in which light running through the core is propagated to another core, that is, crosstalk may be reduced.

In the electrical and optical hybrid film of the present invention, electrical wiring film 2 is preferably longer than optical waveguide film 1 in the longitudinal direction in the spaced portion. The reason why that since electrical wiring film 2 is loose, the electrical and optical hybrid film is made to be bent easily. In addition, in the case where the length of electrical wiring film 2 in the longitudinal direction is longer than the length of optical waveguide film 1 in the longitudinal direction in the spaced portion, when a film is bent and stress is generated on the film, the stress is focused on optical waveguide film 1. At this time, as mentioned above, optical waveguide film 1 can reduce the stress since the slit is provided, so that the resistance of the film to the bending is increased. The difference in the length between the electrical wiring film and the optical waveguide film in the spaced portion is preferably 0.1 to 5 mm.

The shape of the slit of the optical waveguide film may have a curved section in a state where the optical waveguide film is placed flat, but the shape of the slit is preferably linear in the spaced portion. The reason why that in the case where the slit has a curved form, when the electrical and optical hybrid film is bent, the optical waveguides partitioned by the slit are likely to interfere with each other.

In addition, the core is preferably formed in a linear form along the longitudinal direction in the spaced portion. The reason why that in the case where the core is linear, the load applied on the core can be more reduced because there is no concentrated point of stress during the electrical and optical hybrid film is being bent or twisted.

2. Method for Producing Electrical and Optical Hybrid Film

Next, FIG. 2 shows an example of a method for producing the electrical and optical hybrid film of the present invention. Firstly, optical waveguide film 1 having core 10 and clad 11 is prepared. Subsequently, adhesive 3 is applied on the surface of optical waveguide film 1 at a section other than the spaced portion (FIG. 2A). The process of applying an adhesive is not particularly limited, but the adhesive is preferably applied by covering the section to be used as the spaced portion of the surface of optical waveguide film 1 with another film and the like.

Subsequently, electrical wiring film 2 is prepared on which electrical wiring is provided with copper pattern 21, and electrical wiring film 2 and optical waveguide film 1 are bonded by thermal press (FIG. 2B). Upon pressing, electrical wiring film 2 is laminated on optical waveguide film 1 so as to come loose, followed by pressing and heating only the portion to be bonded to obtain an electrical and optical hybrid film in which electrical wiring film 2 is loose.

On the other hand, when electrical wiring film 2 has a thermal expansion coefficient smaller than that of optical waveguide film 1, by overlaying the both films and thermally pressing the whole without loosening electrical wiring film 2, it is possible to form an electrical and optical hybrid film in which electrical wiring film 2 having the smaller thermal expansion coefficient is loose.

Slit 5 is provided on optical waveguide film 1 of the electrical and optical hybrid film thus obtained. The method of providing the slit is not particularly limited, but a dicing saw is preferably used. For example, the electrical and optical hybrid film is set optical waveguide film 1 side up to a dicing apparatus. Slit 5 penetrating optical waveguide film 1 can be provided by adjusting the height of a dicing blade so that only optical waveguide film 1 is cut and then performing the cutting work. Slit 5 may extend between the both ends of optical waveguide film 1 in the longitudinal direction or may be provided only to the spaced portion. FIG. 2 shows an electrical and optical hybrid film in which slit 5 is provided through between the both ends in the longitudinal direction. FIG. 2C is a cross-sectional view viewed from the end face of the electrical and optical hybrid film, and FIG. 2D is a cross-sectional view when the electrical and optical hybrid film is cut in the spaced portion.

The electrical and optical hybrid film may be produced by producing an electrical and optical hybrid film having a large area in advance and providing a slit on the film as mentioned above, followed by cutting out the resulting film to a desired size by a dicing saw or molding router.

In addition, several elements may be mounted on electrical wiring film 2 and then the electrical and optical hybrid film may be connected to an external substrate by using a connector.

When an electrical wiring film and an optical waveguide film of the electrical and optical hybrid film are bonded with each other at the end portions, each end portion may be connected to a connector by inserting the end portion into a connecting portion of the connector. In addition, when the end portions are not bonded with each other, connection to a connector may be made by accommodating the end portion to the connecting portion of the connector, so as to bond the electrical wiring film and the optical waveguide film at the end portion.

The electrical and optical hybrid film of the present invention is used for an electronic apparatus including a cell phone. An electrical and optical hybrid film accommodated in an electronic apparatus may be bent or twisted in the spaced portion. The phrase "may be bent" means that the internally accommodated electrical and optical hybrid film may be in a state being bent when the electronic apparatus is used. The phrase "may be twisted" means that the internally accommodated electrical and optical hybrid film may be in a state being twisted when the electronic apparatus is used. The phrase "is twisted" is an embodiment of being bent and the term "twisting" also refers to torsional bending. Since the electrical and optical hybrid film of the present invention has excellent bending resistance, it is suitable for winding around the axis of a hinge portion of a cell phone and the like.

EXAMPLES

Torsion Test

As shown in FIG. 3, the torsion test was conducted by fixing both ends of a sample to fixing jigs 70 and 71 and subjecting the sample to repeated torsional rotation using the one end of the sample as a rotation axis. The torsion angle was set to 180° for clockwise and anticlockwise rotations when the sample was viewed from vertically overhead. By the test, the number of repeated torsional rotation immediately before sample 72 was broken was defined as the number of times for torsional resistance. The distance "a" between the fixing jigs was set to 10 mm and the sample width of a twisted portion was set to 2.5 mm.

(Sliding Bending Test)

The sliding bending test was conducted by setting the plate clearance to 4 mm, the sliding speed to 500 rpm and the stroke to 30 mm using an apparatus according to JIS C 5016 8.6 (bending resistance). The number of sliding bending at which an electrical and optical hybrid film is broken was measured by this test.

Example 1

Electrical and Optical Hybrid Film Shown in FIG. 4

A polyamide acid solution (OPI-N1005, produced by Hitachi Chemical Co., Ltd.) including 2,2-bis(3,4-dicarboxyphenyl)hexafluoropropane dianhydride (6FDA) and 2,2-bis(trifluoromethyl)-4,4'-diaminobiphenyl (TFDB) was spin-coated on a 5-inch silicon wafer, followed by heat treating the coated wafer to obtain clad layer 13 having a thickness of 20 µm.

Subsequently, a copolymerized polyamide acid solution (OPI-N3405, produced by Hitachi Chemical Co., Ltd.) of 6FDA and TFDB as well as 6FDA and 4,4'-oxydianiline (ODA) was spin-coated on the film, followed by heat treating to obtain core layer 12 having a thickness of 80 µm.

Further, on top the layer, a polyamide acid solution (OPI-N1005, produced by Hitachi Chemical Co., Ltd.) including 6FDA and TFDB was coated so that the thickness after heat treating was 7 µm, followed by heat treating to obtain clad layer 14. Thereafter, the silicon wafer on which these polyimide films were laminated was immersed in an aqueous solution of hydrofluoric acid to peel off the film from the silicon wafer. In this manner, three-layer film 8 (an electrical and optical hybrid film precursor) composed of a polyimide was produced on which clad layer 13, core layer 12 and clad layer 14 were laminated in this order (FIG. 4A). Next, three-layer film 8 mentioned above was cut by 100 mm×100 mm.

An epoxy-based adhesive (EPOX (registered trademark), AH357, produced by Mitsui Chemicals Inc.) was applied on a PET film treated for mold release, which was larger than the size of 100 mm×100 mm by an applicator so that the thickness after drying was 15 µm. The coated film was pre-dried at 100° C. for 10 minutes to prepare an adhesive film of 100 mm×100 mm on the PET film. 40 mm×100 mm of the central part of the film was cut together with the PET film with a cutter. The PET film from which the central part was cut off was laminated on three-layer film 8 mentioned above using an adhesion lamination apparatus. At this time, an adhesion layer formed on the PET film was brought into contact with thick clad layer 13 of three-layer film 8 and the long edge which is the outermost of the adhesion film was overlapped with the edge of three-layer film 8 mentioned above. Subsequently, the PET film was peeled off and adhesion layer 3 was provided on three-layer film 8 mentioned above (FIG. 4B).

Then, by using polyimide film 22 having a thickness of 12.5 µm as a base film, electrical wiring film 2 of 100 mm×100 mm provided with cover film 23 and copper pattern 21 is prepared. Electrical wiring film 2 and three-layer film 8 provided with the adhesion layer were bonded by thermally pressing at 160° C. and approximately 2 MPa to obtain a laminate (FIG. 4C). Thereafter, the laminate was cooled at room temperature to obtain a laminated film in which the central portion of approximately 40 mm×100 mm was spaced. The resulting laminated film was warped while the electrical wiring film 2 was convexed. It was clear from this that the electrical wiring film 2 was longer than three-layer film 8 in the spaced portion. In addition, when both ends of the laminated film were held and pulled up and down softly in the vertical direction, electrical wiring film 2 was found to be loose.

The resulting laminated film of 100 mm×100 mm was set to a dicing saw so that three-layer film 8 was upper side and a groove was formed for forming a slit and a core on three-layer film 8. In the case of this Example, the grooves were provided in parallel to the short side direction of the spaced portion (40×100) of the laminated film. Firstly, two linear grooves 61 and 62 were formed with the dicing blade penetrating clad layer 14 and core layer 12 and stopping within clad layer 13 of three-layer film 8. In the similar manner, further two linear grooves 63 and 64 were provided at a portion slightly away from groove 62. As a result, cores 10 is formed for optically waveguide at a portion sandwiched by groove 61 and groove 62, and at a portion sandwiched by groove 63 and groove 64. Since a dicing saw having a blade width of 30 µm was used in this Example, both widths of cores 10 sandwiched by grooves 61 and 62 and grooves 64 and 64 are approximately 100 µm by setting the interval between grooves 61 and 62 and the interval between grooves 63 and 64 to 130 µm. In this way, a three-layer film was formed into a core-patterned optical waveguide film to obtain a flexible electrical and optical hybrid substrate.

Next, at a portion 130 µm away from groove 62, slit 5 was formed in parallel with groove 62 on optical waveguide film 1 by dicing. The dicing blade was disposed so as to reach the interface between clad layer 13 and adhesive layer 3. In this way, slit 5 penetrating optical waveguide film 1 was formed.

The film on which slit 5 was formed was cut into a piece having a dimension of 2.5 mm in width and 90 mm in length by dicing processing to obtain an electrical and optical hybrid film having a spaced portion with a length of 40 mm in the longitudinal direction. At this time, slit 5 was disposed to be approximately at the center of the width. FIG. 4D shows a view viewed from the end face of the piece of electrical and optical hybrid film, and FIG. 4E is a cross-sectional view when the electrical and optical hybrid film is cut in the spaced portion. As shown in the figures, slit 5 was provided so as to penetrate an optical waveguide film.

The difference in the length in the longitudinal direction between electrical wiring film 2 and optical waveguide film 1 in the spaced portion of the electrical and optical hybrid film was 0.5 mm. The number of times for torsional resistance of the film as a result of the torsion test was 100000. In addition, the film withstood 50000 times of repeated sliding bending in the sliding bending test without torsion.

Example 2

Three-layer film 8 of 100 mm×100 mm was prepared in the same manner as Example 1. Before laminating with electrical wiring film 2, four grooves were formed in three-layer film 8 from the surface of clad layer 14 with a dicing blade in the same manner as Example 1. The grooves were provided so that the bottom portions of the grooves were located within clad layer 13. The intervals between the adjacent two grooves were set to 130 μm in order to form core 10 having a width of approximately 100 μm sandwiched by both grooves. Optical waveguide film 1 was formed in this manner.

An adhesive tape (T4100, produced by Sony Chemical & Information device Corporation) was applied on a surface other than the central region of 40 mm×100 mm of optical waveguide film 1. In this Example, the grooves were arranged to be parallel to the short side direction (40 mm) of the region in which the adhesive tape was not applied. Electrical wiring film 2 was applied on the adhesive tape at room temperature so as not to be loose. The laminate thus obtained was set to a dicing saw to form slit 5 penetrating an optical waveguide film along a core at the portion 130 μm away from the groove defining the core.

The electrical and optical hybrid film on which slit 5 was formed was cut into a shape having a width of 2.5 mm and a length of 90 mm by dicing processing to obtain a piece of the electrical and optical hybrid film provided with slit. At this time, slit 5 was disposed to be approximately at the center of the width of the piece.

The number of times for torsional resistance of the film as a result of the torsion test was 50000.

Example 3

Optical waveguide film 1 of 100 mm×100 mm which is provided with a groove was prepared in the same manner as Example 2. An adhesive tape was applied on a surface other than the central region of 80 mm×100 mm of the film 1. Electrical wiring film 2 was adhered on optical waveguide film 1 at room temperature so as to be loose, and an electrical and optical hybrid film was obtained. At this time, it was arranged that the length of electrical wiring film 2 in the short side direction of the spaced portion (80 mm×100 mm) of the electrical and optical hybrid film was longer than the length of optical waveguide film 1 by 2 mm. Subsequently, in the same manner as Example 2, a slit was provided on the electrical and optical hybrid film, and then a piece of the electrical and optical hybrid film having a width of 2.5 mm and a length of 90 mm was obtained. At this time, slit 5 was disposed to be approximately at the center of the width the piece.

The number of times for torsional resistance of the film as a result of the torsion test was 170000 or more. In addition, the film withstood 50000 times of repeated sliding bending in the sliding bending test with the electrical wiring film outside without torsion.

Comparative Example 1

A laminated film was obtained in which electrical wiring film 2 was loose in the spaced portion in the same manner as Example 1. The resulting laminated film was set to a dicing saw so that three-layer film 8 was upper side and a groove was formed for defining a core in the same manner as Example 1. Subsequently, the electrical and optical hybrid film was cut into a shape having a width of 2.5 mm and a length of 90 mm by dicing processing to obtain a piece of the electrical and optical hybrid film. In the resulting electrical and optical hybrid film, electrical wiring film 2 was loose in the spaced portion but a slit was not provided on the optical waveguide film.

The number of times for torsional resistance of the film as a result of the torsion test was 5000.

Comparative Example 2

An electrical and optical hybrid film having a spaced portion in the same manner as Example 2 was obtained. Subsequently, the electrical and optical hybrid film was cut into a shape having a width of 2.5 mm and a length of 90 mm by dicing processing to obtain a piece of the electrical and optical hybrid film. In the resulting electrical and optical hybrid film, electrical wiring film 2 was loose in the spaced portion but a slit was not provided on the optical waveguide film.

The number of times for torsional resistance of the film as a result of the torsion test was 5000. In addition, the film withstood 50000 times of repeated sliding bending in the sliding bending test without torsion.

INDUSTRIAL APPLICABILITY

The electrical and optical hybrid film of the present invention is used for an electronic apparatus for which optical wiring is required. Since the electrical and optical hybrid film has an especially excellent bending resistance, it is useful for an electronic apparatus and the like accommodating the electrical and optical hybrid film in a narrow space in which the electrical and optical hybrid film is bent or twisted.

The present application claims the priority based on Japanese Patent Application No. 2006-134495 filed on May 12, 2006. The entire contents described in the application specifications and drawings are incorporated herein by reference.

EXPLANATION OF REFERENCE NUMERALS

1 Electrical and optical hybrid film
10 Core
11 Clad
2 Electrical wiring film
21 Copper pattern
22 Polyimide film
23 Cover film
3 Adhesive
4 Spaced portion
5 Slit
61 Groove
62 Groove
63 Groove
64 Groove
70 Fixing jig
71 Fixing jig
72 Sample
8 Three-layer film

The invention claimed is:

1. An electrical and optical hybrid film having an optical waveguide film and an electrical wiring film on the optical waveguide film, comprising a spaced portion in which the electrical wiring film and the optical waveguide film are not bonded with each other between an input portion and an output portion of the optical waveguide film, the electrical wiring film and the optical waveguide film being bonded with each other at the input portion and the output portion, wherein the optical waveguide film has a slit extending in the longitudinal direction in the spaced portion and penetrating the optical waveguide film.

2. The electrical and optical hybrid film according to claim 1, wherein the length of the electrical wiring film in the longitudinal direction in the spaced portion is longer than the length of the optical waveguide film in the longitudinal direction in the spaced portion.

3. The electrical and optical hybrid film according to claim 1, wherein the slit is provided through between the both ends of the optical waveguide film in the longitudinal direction.

4. An electronic apparatus accommodating the electrical and optical hybrid film according to claim 1, wherein the electrical and optical hybrid film is bent or twisted in the spaced portion.

5. The electrical and optical hybrid film according to claim 1, wherein the input portion and the output portion are in the both ends of the electrical and optical hybrid film in the longitudinal direction, respectively.

\* \* \* \* \*